United States Patent
Hayakawa

[11] Patent Number: 5,976,934
[45] Date of Patent: Nov. 2, 1999

[54] METHOD OF MANUFACTURING A NONVOLATILE SEMICONDUCTOR MEMORY DEVICE WITH SELECT GATE BIRD'S BEAKS

[75] Inventor: Toshiyuki Hayakawa, Yokohama, Japan

[73] Assignee: Kabushiki Kaisha Toshiba, Kawasaki, Japan

[21] Appl. No.: 08/971,125

[22] Filed: Nov. 20, 1997

[30] Foreign Application Priority Data

Nov. 22, 1996 [JP] Japan .................................. 8-311534

[51] Int. Cl.$^6$ .......................... H01L 21/336; H01L 29/788
[52] U.S. Cl. ...................... 438/258; 438/257; 438/262; 438/264; 438/265; 257/316; 257/317
[58] Field of Search ..................................... 438/258, 257, 438/262, 264, 265; 257/316, 317

[56] References Cited

U.S. PATENT DOCUMENTS 5,766,996  6/1998  Hayakawa et al. ..................... 438/257
5,879,990  3/1999  Dormans et al. ....................... 438/257

FOREIGN PATENT DOCUMENTS 5-218442  8/1993  Japan .

Primary Examiner—John F. Niebling
Assistant Examiner—Neal Berezny
Attorney, Agent, or Firm—Banner & Witcoff, Ltd.

[57] ABSTRACT

In a method of manufacturing a nonvolatile semiconductor memory device, a first polysilicon conductive layer, which is formed in a peripheral circuit region on a semiconductor substrate with a third gate insulating film interposed therebetween, is patterned into the shape of a gate electrode. A gate bird's beak is formed below the gate electrode in the peripheral circuit region by means of a heat treatment in an oxidizing atmosphere. Subsequently, in a memory cell array region, the first polysilicon conductive layer and a second polysilicon conductive layer laminated thereabove are processed to obtain a stacked gate structure.

19 Claims, 14 Drawing Sheets

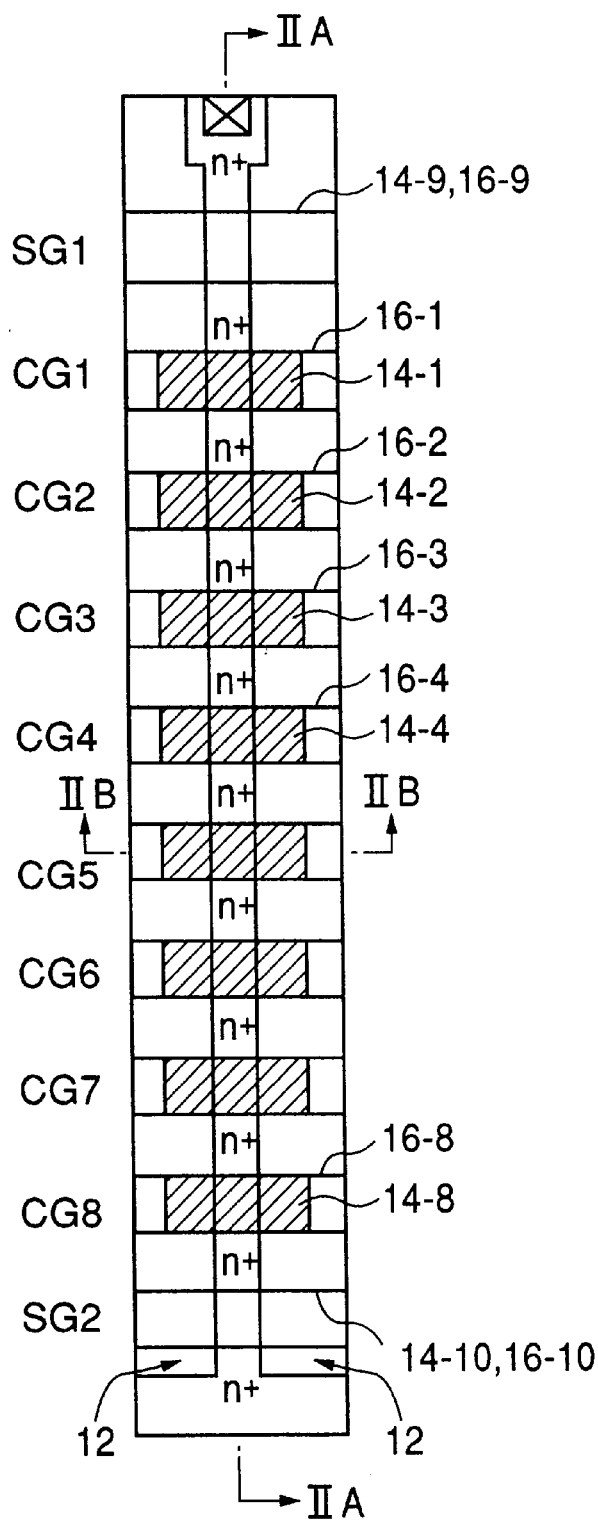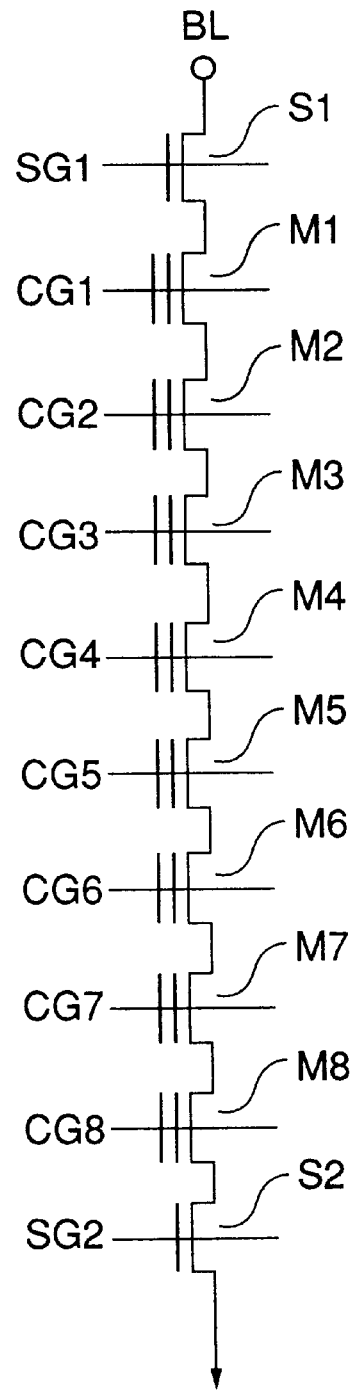
FIG.1A                    FIG.1B

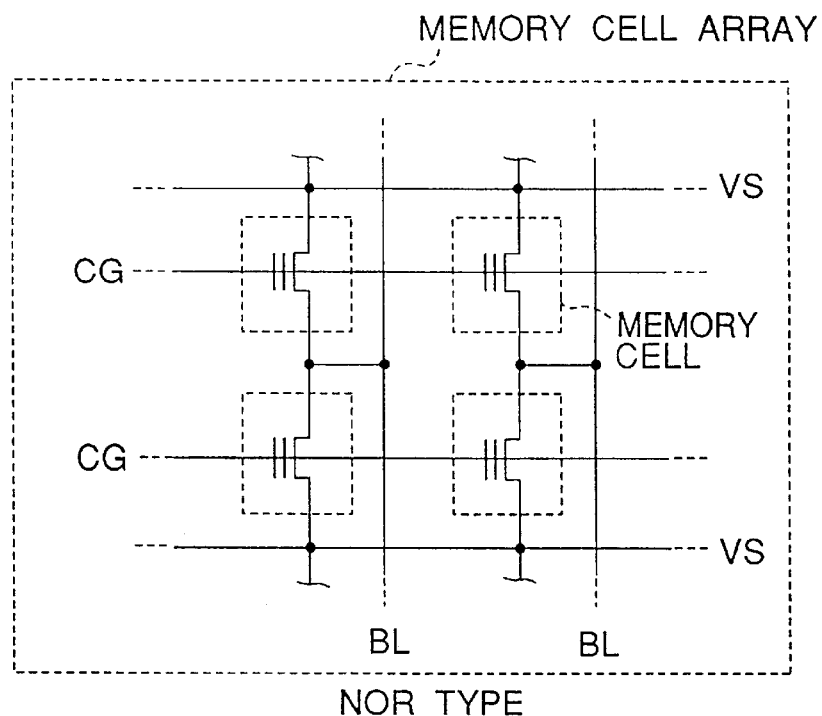
FIG.11A  NOR TYPE
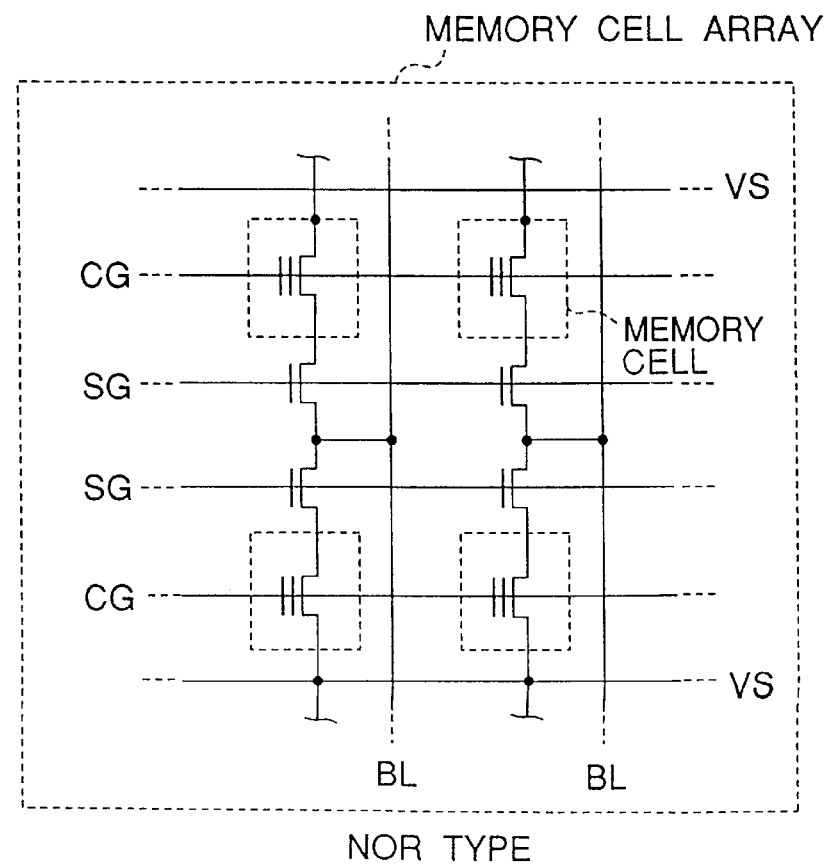
FIG.11B  NOR TYPE

GROUND ARRAY TYPE (NOR TYPE)

ALTERNATE GROUND ARRAY TYPE (NOR TYPE)

METHOD OF MANUFACTURING A NONVOLATILE SEMICONDUCTOR MEMORY DEVICE WITH SELECT GATE BIRD'S BEAKS

BACKGROUND OF THE INVENTION

The present invention relates to a method of manufacturing a nonvolatile semiconductor memory device, and more particularly to a method of manufacturing a nonvolatile semiconductor memory device in which data can be electrically written and erased.

A nonvolatile semiconductor memory device has an advantage in that data cannot be erased even if power is turned off, and for this reason a demand for the memory device has sharply increased in these years. A flash memory, which is a nonvolatile semiconductor memory device capable of performing electrical batch erasure of data, differs from a byte-type non-volatile semiconductor memory device using two transistors and can constitute a memory cell comprising a single transistor. As a result, it is possible to reduce the size of the memory cell, and it is expected that the flash memory will substitute for a large-capacity magnetic disk.

Among such flash memories, a NAND type EEPROM is known, in particular, as being advantageous for attaining higher integration density. The NAND type EEPROM has a structure to be described below. For example, a plurality of memory cells are arranged in a column direction, and the source and drain of adjacent two of the cells are series-connected in succession. Thereby, a unit cell group (or a NAND cell unit) in which a plurality of cells are series-connected is constituted. The unit cell group is connected to a bit line as one unit.

On the other hand, the memory cell has a stacked gate structure in which a floating gate, which normally functions as a charge accumulation layer, and a control gate are stacked on each other. The memory cells are integrally formed in a matrix format in a p-type substrate or a p-type well formed in an n-type substrate. A drain side of the NAND cell unit is connected to a bit line via a selection gate. A source side of the NAND cell unit is connected to a source line (a reference potential line) via a selection gate. The control gates of the memory cells are connected to word lines arranged in the row direction.

When data is to be written in the NAND cell unit, the threshold values of the transistors of all memory cells in the NAND cell unit are, at first, set on the negative side ("1" level) by an erasure operation. Then, data is written in succession from the memory cell remotest from the bit line. Specifically, a high voltage is applied to the control gate of a selected memory cell. Thereby, an intermediate potential is applied to the control gates of the memory cells located on the bit line side and the selection gates. In this state, 0V or an intermediate potential is applied to the bit line according to write data.

If 0V is applied to the bit line, electrons appearing in the channel region between the source and drain regions are injected into the floating gate by an FN tunnel phenomenon. As a result, the threshold value of the transistor of the selected memory cell is shifted to the positive side and "0" data is written. Inversely, when the intermediate potential is applied to the bit line, no electrons are injected in the floating gate and the threshold value of the transistor remains on the negative side. The selected memory cell is set in the data "1" state.

When the written data is to be erased, all control gates are set at 0V and the bit line and source line are set in the floating state. For example, in a case where the memory cell is formed in a p-type well in an n-type substrate, a high voltage is applied to each of the p-type well, n-type substrate and selection gate. Thereby, in all memory cells, electrons in the floating gates are drawn out to the p-type well by the FN tunnel phenomenon. As a result, the threshold of the transistor of each memory cell is shifted to the negative side. In other words, data is erased in all memory cells at a time.

In general, in the NAND cell unit, when the data is written or erased, it is necessary to supply an effectively high electric field between the floating gate and substrate when the high voltage is applied to the control gate or the p-type well and n-type substrate. Thereby the electrons can sufficiently be injected/ejected into/from the floating gate. In this case, the magnitude of the electric field between the floating gate and the substrate is determined by a coupling ratio, i.e. a ratio between the capacitance of the insulating film between the control gate and floating gate and the capacitance of the insulating film between the floating gate and the substrate.

Specifically, at the time of data write, the voltage to be applied between the floating gate and substrate is determined by a value obtained by multiplying the voltage applied to the control gate by the coupling ratio. At the time of data erase, the voltage to be applied between the floating gate and substrate is determined by a value obtained by multiplying the voltage applied to the substrate by the coupling ratio. In the case of a NAND cell unit having a coupling ratio of, e.g. 0.65 and including an insulating film which is formed of a silicon oxide film with a thickness of 0.01 μm between the floating gate and substrate, in order to fully inject or eject electrons into or from the floating gate by the FN tunnel phenomenon, it is necessary to apply a high bias of 20V to the control gate or the p-type well and n-type substrate and to supply an electric field of about 13 MV/cm to the insulating film between the floating gate and substrate. In this case, the relationship between the coupling ratio and the bias at the time of data write or erase is exactly applicable to NOR type memory cells, etc. in which data is written by means of substrate hot electrons.

In the above-described nonvolatile semiconductor memory device having the stacked gate structure comprising the floating gate and control gate, when data is written/erased in/from the memory cell, specific peripheral circuits for controlling the write/erase operations are driven by a high voltage applied to the control gate or the p-type well and n-type substrate. Thus, part of the transistors constituting the peripheral circuits need to comprise high-breakdown voltage transistors having a high insulation breakdown voltage and, in particular, a high drain breakdown voltage under a channel region.

In the prior art, there is a technique wherein MOS transistors constituting part of the peripheral circuits are formed on the semiconductor substrate along with transistors of memory cells. Then, oxidation of a major surface of the gate electrode of the MOS transistor is progressed by post-oxidation, thereby to form a gate bird's beak between the gate electrode and the semiconductor substrate. In other words, concentration of electric field at, in particular, both ends of the gate electrode can be suppressed by forming the gate bird's beak. Thus, the high breakdown voltage transistor having a sufficiently high drain breakdown voltage can be achieved. FIG. 15 is a vertically cross-sectional partial view of a semiconductor memory device thus obtained.

As is shown in FIG. 15, this semiconductor memory device has a stacked gate structure. Specifically, in a memory cell array region 50 on a semiconductor substrate 41 formed of a p-type silicon semiconductor substrate, a floating gate 43 and a control gate 45 consisting mainly of polysilicon are stacked with first and second gate insulating films 42 and 44 formed of silicon oxide films, etc. interposed. On the other hand, in a peripheral circuit region 51, a gate electrode 49 consisting mainly of polysilicon is provided in the state in which a third gate insulating film 48 consisting of a silicon oxide film, etc. is interposed between the substrate 41 and the gate electrode 49. Source and drain regions 46 formed of $n^+$-diffusion layers are formed in the memory cell array region 50 and peripheral circuit region 51 of the semiconductor substrate 41 on both sides of the gates. A post-oxidation film 47 is provided to cover the entire surface of the substrate 41. In FIG. 15, reference numeral 40 denotes a field oxide film formed selectively in a device isolation region of the semiconductor substrate 41.

In FIG. 15, reference numeral 47*a* denotes a gate bird's beak formed between the gate electrode 49 and the semiconductor substrate 41. Since the gate bird's beak 47*a* is formed, as described above, end portions of the gate electrode 49 are rounded and concentration of electric field at both ends of the gate electrode 49 is avoided. Moreover, it is possible to attain a sufficient thickness of the third gate insulating film 48 lying between the gate electrode 49 and semiconductor substrate 41. Thus, the insulation breakdown voltage, e.g. a drain breakdown voltage, of a completed MOS transistor is increased. In this prior art, the gate bird's beak 47*a* is formed by a heat treatment in an oxidizing atmosphere after the stacked gate structure of the floating gate 43 and control gate 45, the gate electrode 49 and source and drain regions 46 are formed.

When the gate bird's beak 47*a* is formed by post-oxidation on the MOS transistor in the peripheral circuit region 51, however, a gate bird's beak 47*b* is also formed at the same time between the floating gate 43 and control gate 45 in the memory cell array region 50. As the formation of the gate bird's beak 47*b* progresses between the floating gate 43 and control gate 45, the effective thickness of the second gate insulating film 44 lying between the floating gate 43 and control gate 45 increases and the effective area thereof decreases, resulting in an decrease in the capacitance of the second gate insulating film 44. Consequently, the coupling ratio between the capacitance of the second gate insulating film 44 and that of the first gate insulating film 42 decreases. As a result, a necessary voltage to be applied in order to write or erase data in the NAND cell unit increases and a power consumption of the nonvolatile semiconductor memory device may increase. Besides, a higher insulation breakdown voltage may be required for the high breakdown voltage transistor on the peripheral circuit region 51.

As has been described above, in the nonvolatile semiconductor memory device having the stacked gate structure comprising the floating gate and control gate, there is an attempt in the prior art to increase the insulation breakdown voltage of the high breakdown voltage transistor constituting part of the peripheral circuit by forming the gate bird's beak between the gate electrode and the semiconductor substrate by post-oxidation. However, in the prior art, a gate bird's beak is similarly formed in the transistor of the memory cell and a necessary voltage to be applied in order to write or erase data in the memory cell increases.

BRIEF SUMMARY OF THE INVENTION

The present invention has been made in consideration of the above problems and its object is to provide a method of manufacturing a nonvolatile semiconductor memory device, wherein the insulation breakdown voltage of a high-breakdown-voltage type transistor in a peripheral circuit region can be increased, while a bias voltage applied to a memory cell region to write or erase data is not increased.

According to a first aspect of the invention, there is provided a method of manufacturing a nonvolatile semiconductor memory device having a memory cell array region and a peripheral circuit region defined on a semiconductor substrate, the method comprising the steps of:

forming an insulating film on the memory cell array region and the peripheral circuit region;

forming a first conductive layer on the insulating film;

patterning the first conductive layer into a gate electrode shape in the peripheral circuit region;

subjecting the first conductive layer thus patterned to a heat treatment in an oxidizing atmosphere;

laminating a second conductive layer over the first conductive layer in the memory cell array region and the peripheral circuit region;

patterning the first and second conductive layers into predetermined shapes in the memory cell array region; and removing the second conductive layer in the peripheral circuit region.

According to a second aspect of the invention, there is provided a method of manufacturing a nonvolatile semiconductor memory device having a memory cell array region and a peripheral circuit region defined on a semiconductor substrate, the method comprising the steps of:

forming an insulating film on the memory cell array region and the peripheral circuit region;

forming a first conductive layer on the insulating film;

patterning the first conductive layer into a gate electrode shape in the peripheral circuit region;

subjecting the first conductive layer thus patterned to a heat treatment in an oxidizing atmosphere;

laminating a second conductive layer over the first conductive layer in the memory cell array region and the peripheral circuit region;

patterning the first and second conductive layers into predetermined shapes in the memory cell array region, while selectively removing the second conductive layer in the peripheral circuit region so that part of the second conductive layer is selectively left on a side wall of the first conductive layer; and subjecting the second conductive layer selectively left on the side wall of the first conductive layer to a heat treatment in an oxidizing atmosphere.

Specifically, according to the method of manufacturing the nonvolatile semiconductor memory device of this invention, the first conductive layer is formed on the memory cell array region and peripheral circuit region of the semiconductor substrate with the insulating film interposed therebetween. In the peripheral circuit region, the first conductive layer is processed into the shape of gate electrode, and then subjected to a heat treatment to form the gate bird's beak. Subsequently, the second conductive layer is laminated over the first conductive layer, and the resultant structure is processed into a predetermined shape in the memory cell array.

As has been described above, according to the method of manufacturing the nonvolatile semiconductor memory device of this invention, before the first and second conductive layers laminated on the semiconductor substrate with the insulating layers interposed therebetween are processed into predetermined shapes in the memory cell array region, the first conductive layer processed into the shape of gate electrode in the peripheral circuit region is heat-treated to form the gate bird's beak. In this step of heat treatment, formation of a gate bird's beak does not substantially progress in the memory cell array region. For example, in the case of forming a memory cell having a stacked gate structure of a floating gate and a control gate, a decrease in a coupling ratio, i.e. a ratio between the capacitance of the insulating film between the control gate and floating gate and the capacitance of the insulating film between the floating gate and the substrate, can be suppressed.

In the above case, even if the first conductive layer is partially processed in the memory cell array region prior to the heat treatment of the first conductive layer, no problem will arise. It should suffice if the first and second conductive layers in the memory cell array region are finally shaped after the heat treatment is performed to form the gate bird's beak in the peripheral circuit region. For example, in the case of forming the stacked gate structure of a floating gate and a control gate, a predetermined processing step may be performed in the memory cell array region after the first conductive layer, which will become the floating gate, is formed and before the first conductive layer is heat-treated. Specifically, when the first conductive layer in the peripheral circuit region is processed into the shape of gate electrode, a slit-like space may be provided, from the standpoint of reduction in number of manufacturing steps, in the first conductive layer in the memory cell array region in association with a device isolation region.

When the first conductive layer is heat-treated, the gate bird's beak is formed on the lower side of the first conductive layer in the peripheral circuit region and a thermal oxidation film is formed on the upper surface and side wall of the first conductive layer. Accordingly, in the present invention, the thermal oxidation film can directly be used as an insulating film between the first and second conductive layers in the memory cell array region, and the number of manufacturing steps can be further reduced.

On the other hand, in the present invention, the gate electrode of the transistor constituting part of the peripheral circuit is obtained by processing the first conductive layer, as mentioned above. Thus, the second conductive layer laminated over the first conductive layer in the peripheral circuit region can be dispensed with. In other words, the second conductive layer laminated in the peripheral circuit region has to be removed. The second conductive layer may be removed in a step completely separate from the step of processing the first and second conductive layers in the memory cell array regions (the first aspect of the invention), or may be removed simultaneously in the step of processing the first and second conductive layers (the second aspect of the invention).

Specifically, in the first aspect of the invention, the first and second conductive layers in the memory cell array region are processed by means of anisotropic etching such as RIE (Reactive Ion Etching). On the other hand, in the peripheral circuit region, the second conductive layer is removed by means of isotropic etching such as CDE (Chemical Dry Etching). In this case, the second conductive layer of the peripheral circuit region, which is laminated on the upper surface and side wall of the first conductive layer having the shape of gate electrode with the thermal oxidation film interposed therebetween, is completely removed from both the upper surface and side wall of the first conductive layer by means of the isotropic etching.

In the second aspect of the invention, when the first and second conductive layers in the memory cell array region are processed by means of anisotropic etching such as RIE (Reactive Ion Etching), the second conductive layer in the peripheral circuit region is removed. In the second aspect, however, since the second conductive layer in the peripheral circuit region is removed by anisotropic etching, the second conductive layer is selectively left on the side-wall side of the first conductive layer. The second conductive layer selectively left on the side-wall side of the first conductive layer is subjected to a heat treatment in an oxidizing atmosphere. As a result, the second conductive layer selectively left on the side-wall side of the first conductive layer in the peripheral circuit region is oxidized, and a gate side-wall oxidation film is formed. Accordingly, the absolute breakdown voltage of the transistor constituting a part of the peripheral circuit can be further increased.

As has been described above, the second conductive layer in the peripheral circuit region is removed and the first and second conductive layers in the memory cell array region are processed into predetermined shapes. Thereafter, in this invention, the semiconductor substrate is doped with impurities by means of ion implantation, etc. with the first and second conductive layers in the memory cell array region and the first conductive layer processed into the shape of gate electrode in the peripheral circuit region being generally used as masks. Thus, the source and drain regions of the transistor of the memory cell or the high-breakdown-voltage transistor constituting the part of the peripheral circuit are obtained. Accordingly, this invention can provide a nonvolatile semiconductor memory device comprising, for example, the transistor of the memory cell having a sufficiently high coupling ratio of the stacked gate structure of the floating gate and control gate, and the high-breakdown-voltage transistor in the peripheral circuit, the absolute breakdown voltage of which is increased by the provision of the gate bird's beak.

The present invention is suitable for manufacture of a nonvolatile semiconductor memory device including a memory cell having a stacked gate structure of a floating gate and a control gate in a memory cell array region, wherein an insulating film in the memory cell, provided between a semiconductor substrate and the floating gate formed of a first conductive layer, becomes a tunnel oxidation film. Specifically, the nonvolatile semiconductor memory device, to which the present invention is suitably applied, comprises a memory cell provided in a memory cell array region defined on a semiconductor substrate and a MOS transistor constituting a part of a peripheral circuit provided in a peripheral circuit region defined on the semiconductor substrate. The memory cell comprises a first source region and a first drain region formed in the semiconductor substrate, a first gate insulating film formed on the semiconductor substrate between the first source and drain regions, a floating gate formed on the first gate insulating film as a charge accumulation layer, a second gate insulating film formed on the floating gate, and a control gate formed on the second gate insulating film. The MOS transistor comprises a second source region and a second drain region formed in the semiconductor substrate, a third gate insulating film formed on the semiconductor substrate between the second source and drain regions, and a gate electrode formed on the third gate insulating film. According to a third aspect of the invention, there is provided a method of manufacturing such a nonvolatile semiconductor memory device, the method comprising the steps of:

forming the first and third gate insulating films on the memory cell array region and the peripheral circuit region;

forming a first conductive layer on the first and third gate insulating films;

patterning the first conductive layer, thereby providing a slit-like space in the memory cell array region while processing the first conductive layer into the gate electrode in the peripheral circuit region;

subjecting the first conductive layer thus patterned to a heat treatment in an oxidizing atmosphere and forming a thermal oxidation film;

laminating a second conductive layer over the first conductive layer at least in the memory cell array region; and patterning in succession the second conductive layer, the thermal oxidation film and the first conductive layer in the memory cell array region, thereby forming the control gate, the second gate insulating film and the floating gate.

According to the third aspect, as described in the above first and second aspects, when the first conductive layer in the peripheral circuit region is processed into the shape of gate electrode, a slit-like space is provided in the first conductive layer in the memory cell array region in association with a device isolation region. In this case, too, when the first conductive layer is heat-treated, the gate bird's beak is formed on the lower side of the first conductive layer in the peripheral circuit region and a thermal oxidation film is formed on the upper surface and side wall of the first conductive layer. Accordingly, the thermal oxidation film obtained in the memory cell array region can directly be used as the second gate insulating film lying between the floating gate and control gate. Specifically, if a first conductive layer formed mainly of, e.g. polysilicon is formed and the surface thereof is thermally oxidized in the heat treatment step, a silicon oxide film suitable as the second gate insulating film lying between the floating gate and control gate is provided.

In the present invention, this thermal oxidation film, as a single layer, may constitute the second gate insulating film. However, in the case of manufacturing the above-described nonvolatile semiconductor memory device having the stacked gate structure of the floating gate and control gate, it is desirable that a nitride film and an oxide film be further stacked on the thermal oxidation film. Thereby, a so-called ONO (Oxide-Nitride-Oxide) lamination film comprising a silicon oxide film, a silicon nitride film and a silicon oxide film may be formed as the second gate insulating film. In the manufacture of this nonvolatile semiconductor memory device, too, the semiconductor substrate may be doped with impurities by means of ion implantation, etc. with the stacked gate structure of the floating gate and control gate in the memory cell array region and the gate electrode in the peripheral circuit region being used as masks. Thereby, exactly as in the first and second aspects of the invention, the source and drain regions of the transistor of the memory cell or the high-breakdown-voltage transistor in the peripheral circuit can be easily obtained.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are a plan view showing a NAND cell unit and its circuit diagram, respectively, in a NAND type EEPROM;

FIGS. 11A and 11B are circuit diagrams showing memory cells of NOR type EEPROMs, the circuit shown in FIG. 11A having no selection gates, the circuit shown in FIG. 11B having selection gates;

DETAILED DESCRIPTION OF THE INVENTION

Figure 2A:
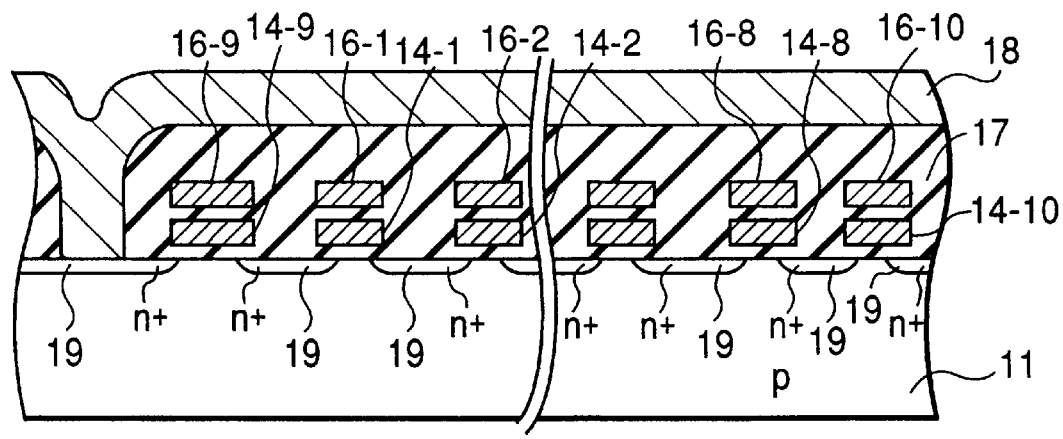
FIGS. 2A and 2B are cross-sectional views taken along line IIA—IIA and line IIB—IIB, respectively, in FIG. 1A.
Figure 2B:
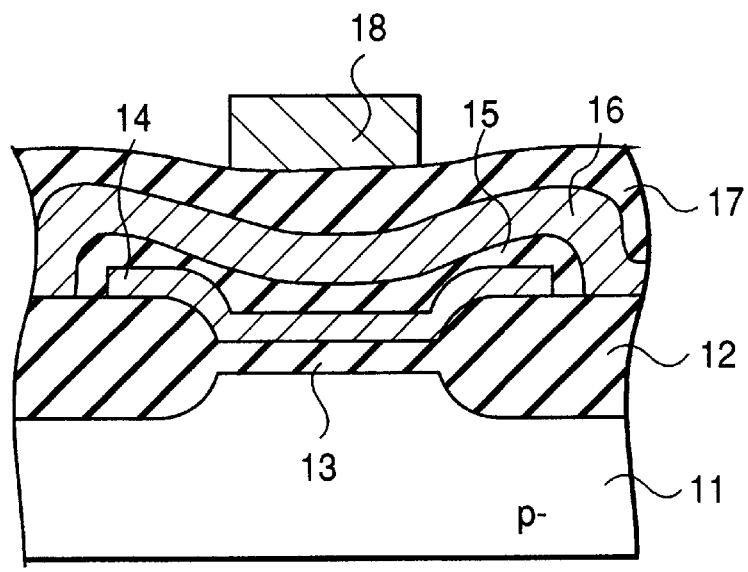
Figure 3:
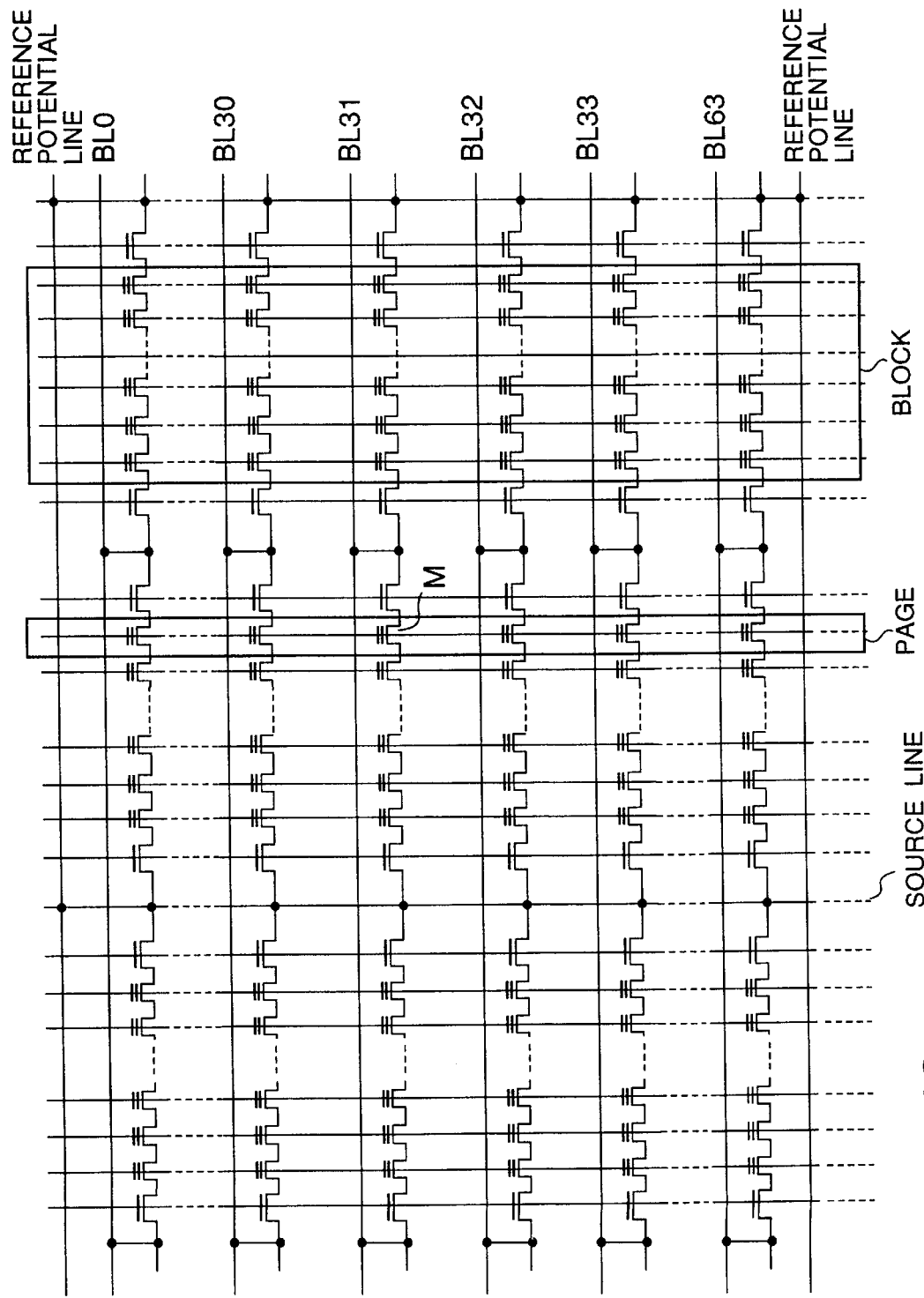
FIG. 3 is a circuit diagram showing memory cells of the NAND type EEPROM.

FIGS. 1A and 1B and FIGS. 2A and 2B show a NAND type EEPROM as an example of a nonvolatile semiconductor memory device manufactured by the present invention. FIG. 1A is a plan view of a NAND cell unit, FIG. 1B is a circuit diagram of the NAND cell unit, FIG. 2A is a cross-sectional view taken along line IIA—IIA in FIG. 1A, and FIG. 2B is a cross-sectional view taken along line IIB—IIB in FIG. 1A. FIG. 3 is a circuit diagram showing memory cells of the NAND type EEPROM. As is shown in these figures, eight memory cells M1 to M8 are connected in series to constitute one NAND cell unit.

Specifically, each memory cell has a stacked gate structure wherein a floating gate 14 (14-1, 14-2, ..., 4-8) serving as a charge accumulation layer and a control gate 16 (16-1, 16-2, ..., 16-8) are stacked over a p-type silicon semiconductor substrate 11. In this stacked gate structure, a first gate insulating film 13 provided between the semiconductor substrate 11 and floating gate 14 functions as a tunnel oxidation film for injecting or ejecting electrons into or from the floating gate 14. The floating gate 14 and control gate 16 are capacitive-coupled with a second gate insulating film 15 interposed therebetween. Each of n-type diffusion layers serves, on the one hand, as a source of one of two adjacent memory cells and serves, on the other hand, as a drain of the other memory cell. Thereby, the memory cells are series-connected.

Besides, a selection gate 14-9, 16-9 and a selection gate 14-10, 16-10, which are formed by the same process as the floating gates 14 and control gates 16 of the memory cells, are provided on the drain and source sides of the NAND cell unit. The two layers of each of the selection gate 14-9, 16-9 and the selection gate 14-10, 16-10 are electrically connected at a certain region (not shown). The upper surface of the p-type silicon semiconductor substrate 11, in which the devices are thus formed, is covered with an interlevel insulating film 17. A bit line 18 is provided on the interlevel insulating film 17. The bit line 18 is put in contact with the drain-side n-type diffusion layer 19 at one end of the NAND cell unit.

The control gates 14 in the same row of a plurality of NAND cell units arranged in the row direction are commonly connected. These control gates 14 are provided as control gate lines CG1, CG2, ..., CG8 extending in the row direction. The control gate lines serve as so-called word lines. In addition, the selection gates 14-9, 16-9 and 14-10, 16-10 are provided as selection gate lines SG1 and SG2 extending in the row direction.

A method of manufacturing the nonvolatile semiconductor memory device will now be described with reference to the accompanying drawings. FIGS. 4A to 4C and FIGS. 5A to 5C are vertically cross-sectional partial views showing in succession the steps of a manufacturing method according to a first embodiment of the invention. In the figures, reference numeral 30 denotes a memory cell array region in which a number of memory cells having the above-described stacked gate structure are formed in a matrix format, and reference numeral 31 a peripheral circuit region in which peripheral circuits for the memory cells are formed. FIGS. 6A to 6C and FIGS. 7A to 7C are, respectively, cross-sectional views taken along lines VI—VI and VII—VII in FIGS. 4A to 4C and 5A to 5C.

Figure 4A:
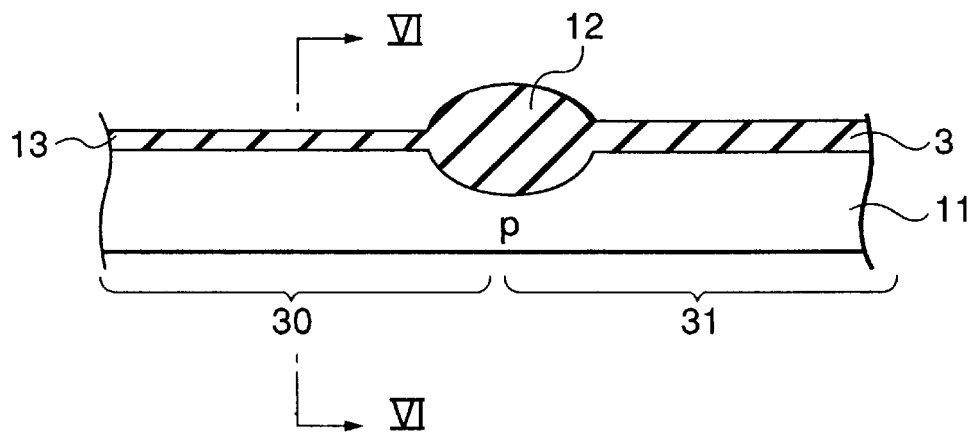
FIGS. 4A to 4C are vertically cross-sectional partial views illustrating in succession the former steps of a manufacturing method according to a first embodiment of the present invention.
Figure 6A:
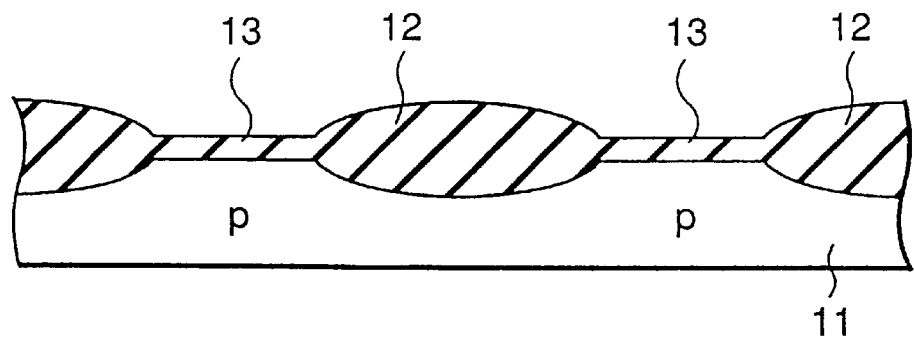
FIGS. 6A to 6C are cross-sectional views taken along lines VI—VI in FIGS. 4A to 4C.

In the first embodiment, at first, p-type impurities are implanted, as required, into a device isolation region on a p-type silicon semiconductor substrate 11. Then, a field oxidation film 12 is formed, for example, by a selective oxidation method. Subsequently, as shown in FIGS. 4A and 6A, a thermal oxidation film about 8 to 25 nm thick, which will become a first gate insulation film 13, is formed in the memory cell array region 30, and a thermal oxidation film about 25 to 50 nm thick, which will become a third gate insulation film 3, is formed in the peripheral circuit region 31. Specifically, after a thermal oxidation film about 25 to 50 nm thick, which will become, for example, the third gate insulation film 3, is formed on the entire surface of the semi-conductor substrate 11, the peripheral circuit region 31 is covered with a resist film by means of photolithography, while exposing the memory cell array region 30. The thermal oxidation film on the memory cell array region 30 is etched away. Subsequently, the resist film on the peripheral circuit region 31 is removed, and the surface of the semiconductor substrate 11 is thermal-oxidized once again. Thus, a thermal oxidation film about 8 to 25 nm thick, which will become the first gate insulation film 13, is formed in the memory cell array region 30.

Figure 4B:
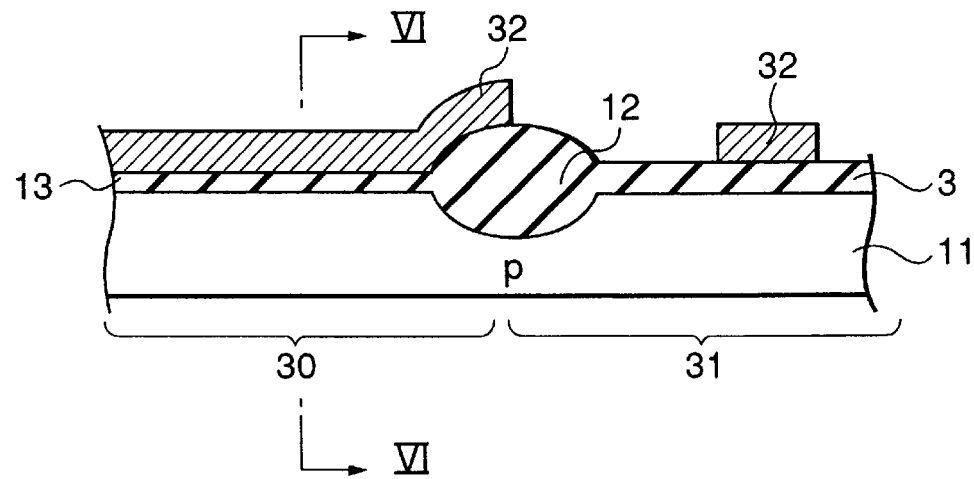
Figure 6B:
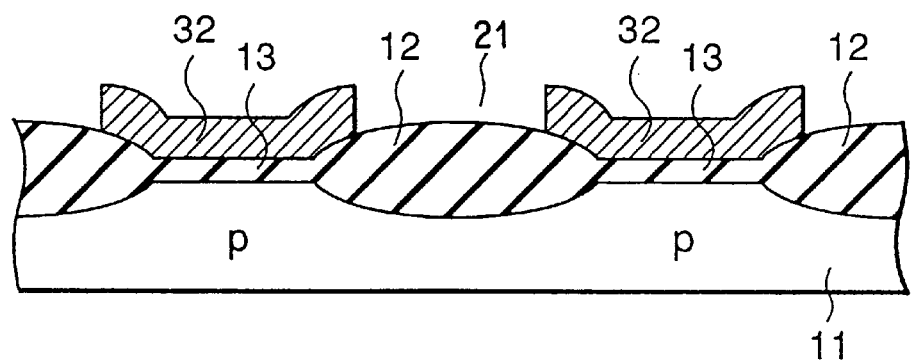

Subsequently, a first polysilicon conductive film 32 about 50 to 200 nm thick is deposited on the thermal oxidation film on the memory cell array region 30 and peripheral circuit region 31. In this case, the resistance of the first polysilicon conductive film 32 is decreased by doping with P (phosphorus) in an amount of $1 \times 10^{20}$ to $4 \times 10^{20}$ cm$^{-3}$ by using, e.g. POCl$_3$. Then, a predetermined resist pattern is formed on the first polysilicon conductive layer 32 by means of photolithography. Using this resist pattern as a mask, the first polysilicon conductive layer 32 is etched and then the resist pattern is removed. Thus, a slit-like space 21 is provided on the field oxidation film 12 on the memory cell array region 30, as shown in FIG. 6B. In the peripheral circuit region 31, as shown in FIG. 4B, the first polysilicon conductive layer 32 is processed into a gate electrode shape.

Figure 4C:
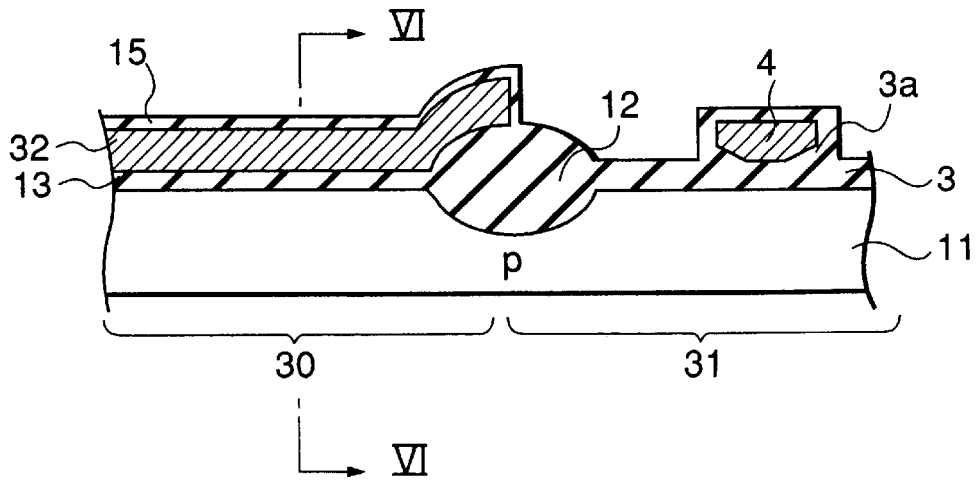
Figure 6C:
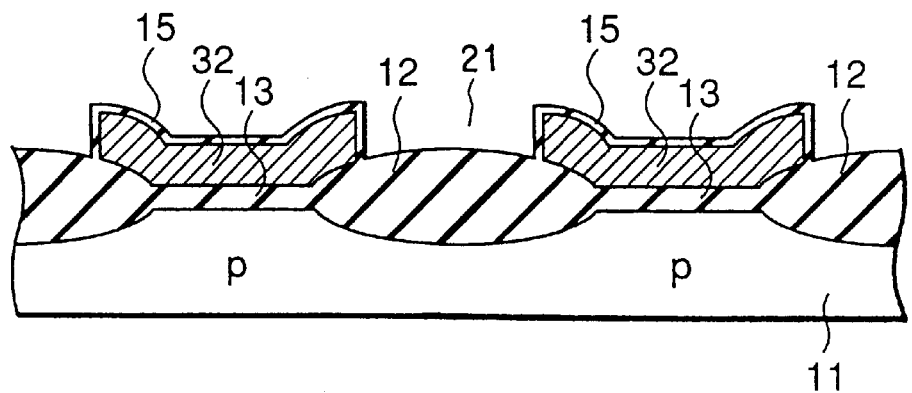

Then, the first polysilicon conductive layer 32 is subjected to a heat treatment in an oxidizing atmosphere, e.g. in the air. The conditions for the heat treatment are as follows: the temperatures are, for example, 800 to 900° C.; and the thickness of the thermal oxidation film on the semiconductor substrate 11, from which the first polysilicon conductive layer 32 has been etched away, is 5 to 30 nm. In this step, as shown in FIG. 4C, a gate bird's beak 3a is formed between the gate electrode 4 and semiconductor substrate 11 in the peripheral circuit region 31, which has been processed into the completed shape. Thereby, the concentration of electric field at both ends of the gate electrode 4 is relaxed, and the insulation breakdown voltage between the gate electrode 4 and semiconductor substrate 11 is increased. On the other hand, in the memory cell array region 30, the upper surface of first polysilicon conductive layer 32 and the side wall of first polysilicon conductive layer 32, which faces the space 21 on the field oxide film 12, are thermal-oxidized, and a silicon oxidation film is formed thereon, as shown in FIG. 6C. If a silicon nitride film and a silicon oxide film are further deposited in succession by means of, e.g. CVD on the silicon oxidation film, the silicon oxidation film formed by thermal oxidation is used, as it stands, as the bottom oxidation film of an ONO lamination film serving as a second gate insulating film 15 in the memory cell array region 30.

If the thickness of the thermal oxidation film formed in the above process is too small, a silicon oxide film, a silicon nitride film and a silicon oxide film may be deposited, following the thermal oxidation, so that an ONO lamination film may be formed. Inversely, if the thickness of the thermal oxidation film is too great, the thickness of the silicon oxide film laminated on the silicon nitride film may be reduced so as to control the thickness of the entire structure. It is desirable that the thickness of the ONO lamination film be about 15 to 30 nm.

Figure 5A:
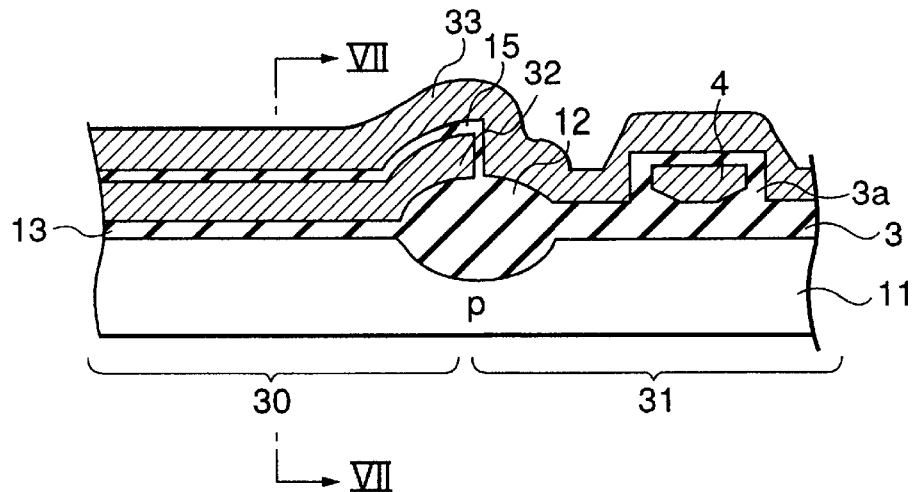
FIGS. 5A to 5C are vertically cross-sectional partial views illustrating in succession the latter steps of the manufacturing method according to the first embodiment of the present invention.
Figure 7A:
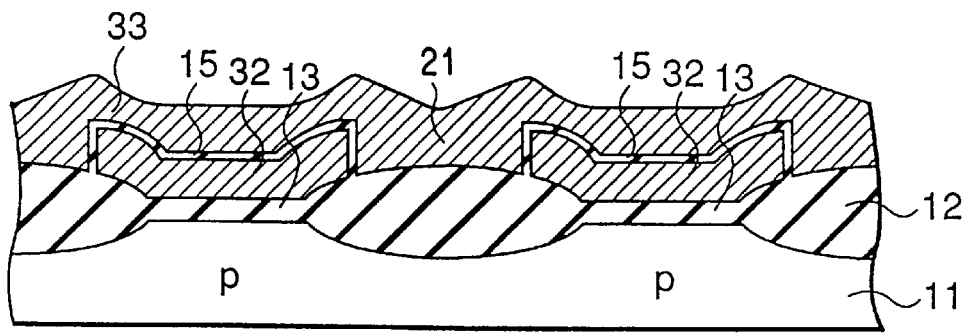
FIGS. 7A to 7C are cross-sectional views taken along lines VII—VII in FIGS. 5A to 5C.
Figure 7B:
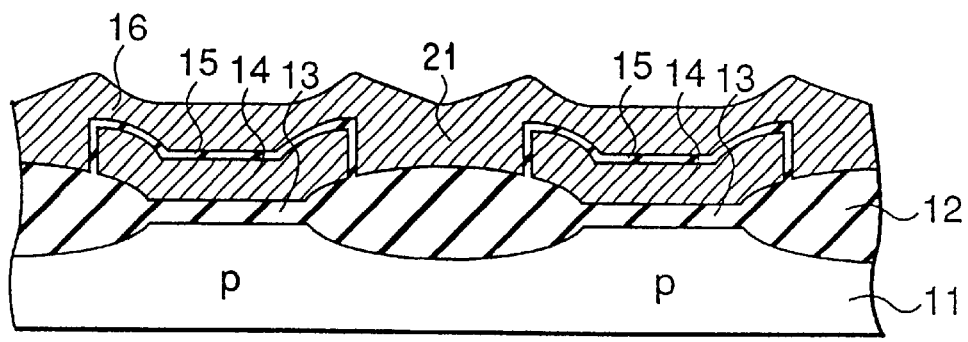
Figure 7C:
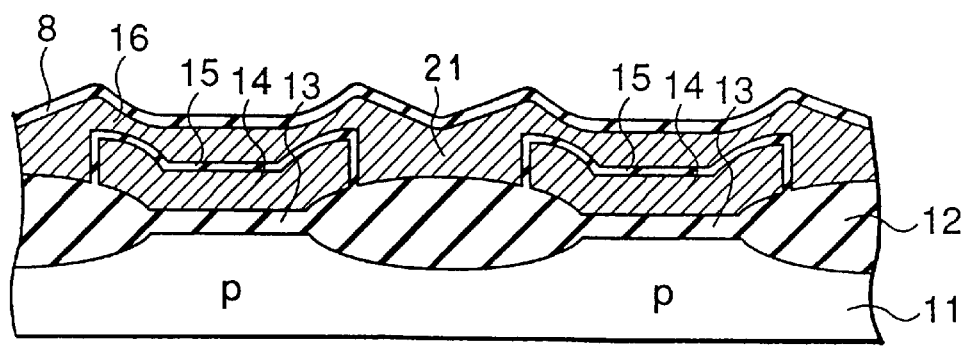

Then, as shown in FIGS. 5A and 7A, like the case of the first polysilicon conductive layer 32, a second polysilicon conductive layer 33 doped with P in an amount of $1 \times 10^{20}$ to $4 \times 10^{20}$ cm$^{-3}$, or a lamination film of such a polysilicon layer and a metal silicide, is deposited on the ONO lamination layer to a thickness of about 150 to 350 nm. Then, a predetermined resist pattern is formed by means of photolithography, following which the first polysilicon conductive layer 32 and second polysilicon conductive layer 33 are patterned in the memory cell array region 30. Thereafter, the resist pattern is removed. Specifically, using the resist pattern as a mask, the second polysilicon conductive layer 33, ONO lamination film and first polysilicon conductive layer 32 in the memory cell array region 30 are anisotropically etched by RIE in succession and processed into the completed shape. As a result, the floating gate 14, second gate insulating film 15 and control gate 16 in the lamination gate structure of the memory cell are obtained. In addition, selection gates on the drain and source sides, as shown in FIG. 2A, are also formed.

Figure 5B:
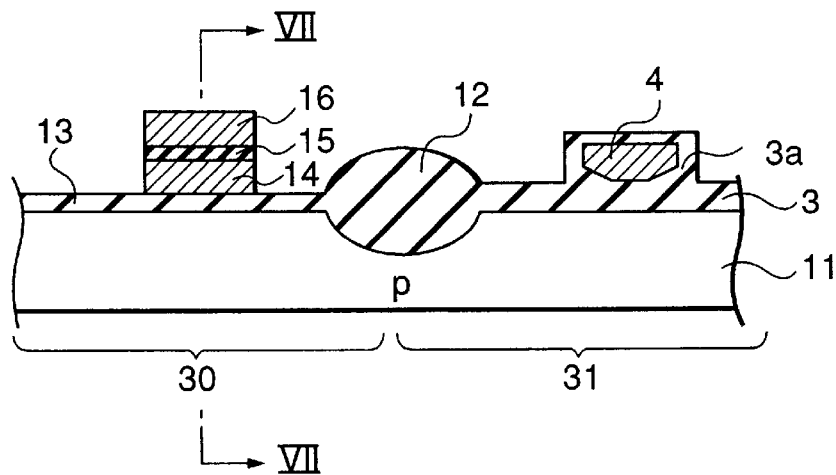

Subsequently, a resist film covering the memory cell array region 30 is formed by means of photolithography. Using the resist film as a mask, the second polysilicon conductive layer 33 in the peripheral circuit region 31 and, if necessary, the silicon oxide film and silicon nitride film below the second polysilicon conductive layer 33 are etched away. Then, the resist pattern is removed. In this case, the second polysilicon conductive layer 33 exposed by a CDE method is isotropically etched, and the second polysilicon conductive layer 33 in the peripheral circuit region 31 is completely removed, as shown in FIG. 5B.

An oxide thin layer 8 is then formed on the entire surface of semiconductor substrate 11 by means of thermal oxidation, etc., as a post-oxidation for the lamination gate structure of floating gate 14 and control gate 16. The condition for thermal oxidation in this case is generally determined such that the thickness of the oxide thin layer 8 formed on the control gate 16 becomes about 8 nm. Although the formation of the oxide thin layer 8 is not indispensable, it is desirable for the following reason to form the oxide thin layer 8 to such a degree that the formation of a gate bird's beak does not progress excessively. If the oxide thin layer 8 is formed in the memory cell array region 30, corner portions at both ends of the floating gate 14 and control gate 16 can be rounded and thus the concentration of electric field can be reduced.

Figure 5C:
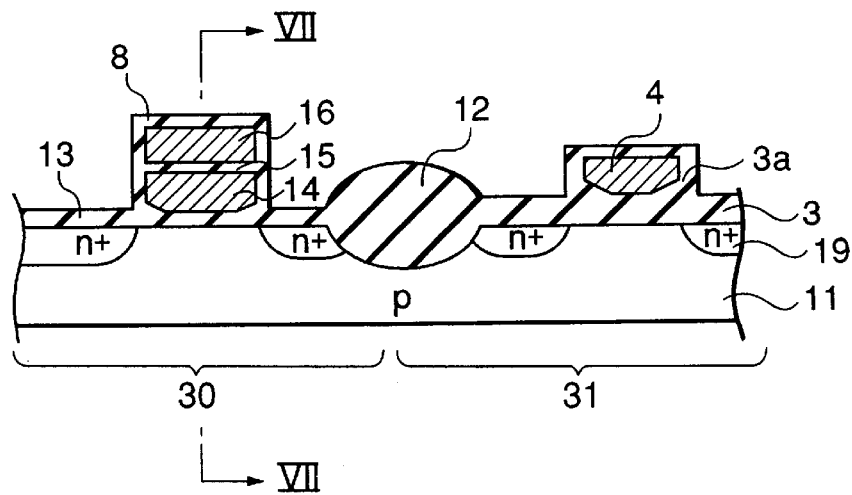

As is shown in FIG. 5C, the semiconductor substrate 11 is doped with n-type impurities such as P or As by means of an ion implantation method, with the control gate 16 and floating gate 14 being used as masks in the memory cell array region 30 and with the gate electrode 4 being used as a mask in the peripheral circuit region 31. Thereby, n-type diffusion layers 19, which will become source and drain regions of transistors of memory cells and MOS transistors constituting part of peripheral circuits, are provided. Subsequently, although not shown, an interlevel insulating film formed of a silicon oxide film is deposited by a CVD method on the entire surface of the semiconductor substrate 11. A contact hole for contact with a specific n-type diffusion layer 19 is formed in the obtained interlevel insulating film, and then a wiring layer of a bit line, etc., which is to be electrically connected to the n-type diffusion layer 19 via the contact hole, is provided. Thus, a nonvolatile semiconductor memory device, as shown in FIGS. 1A and 1B and FIGS. 2A and 2B, is fabricated.

Figure 8A:
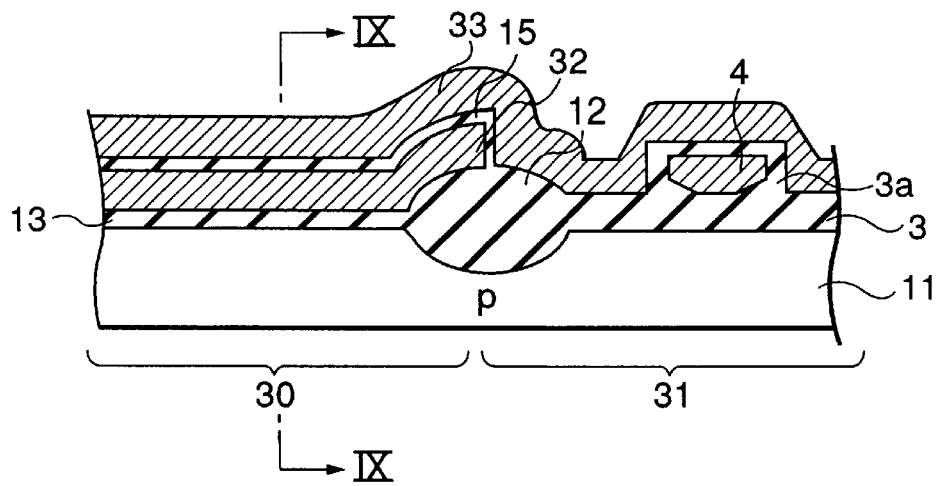
FIGS. 8A to 8C are vertically cross-sectional partial views illustrating in succession the steps of a manufacturing method according to a second embodiment of the present invention.
Figure 8B:
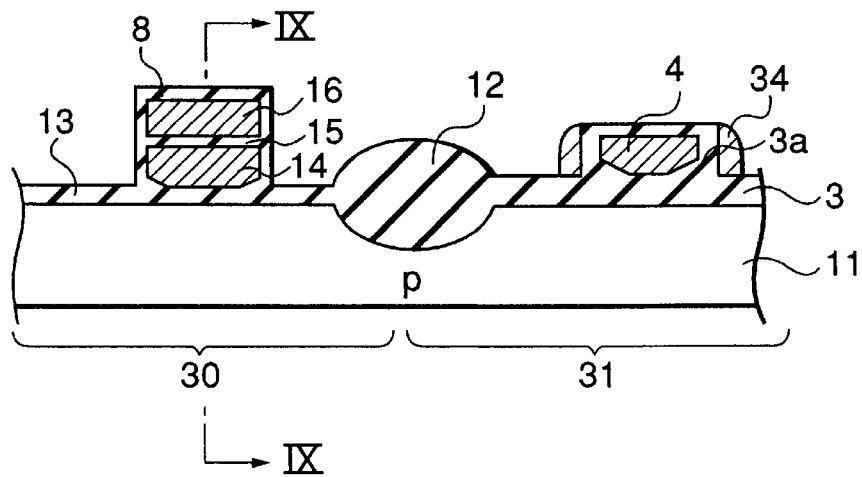
Figure 8C:
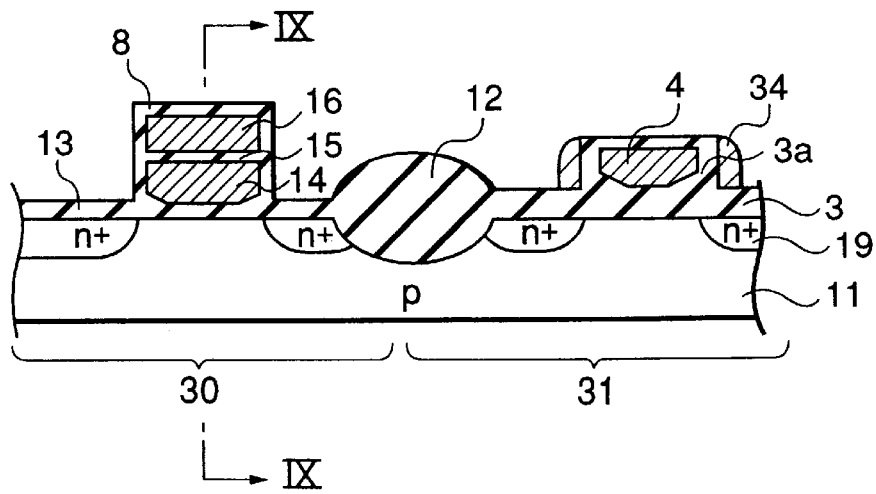
Figure 9A:
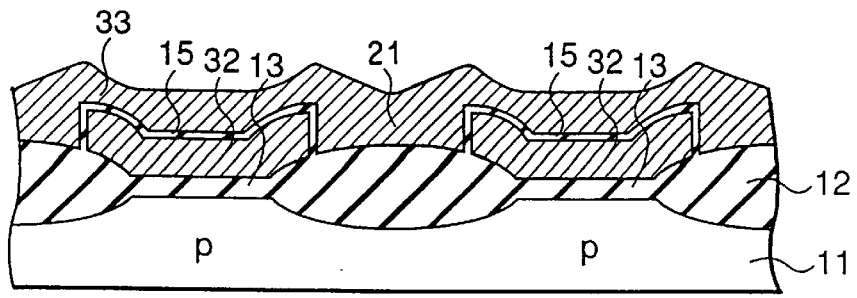
FIGS. 9A to 9C are cross-sectional views taken along lines IX to IX in FIGS. 8A to 8C.
Figure 9B:
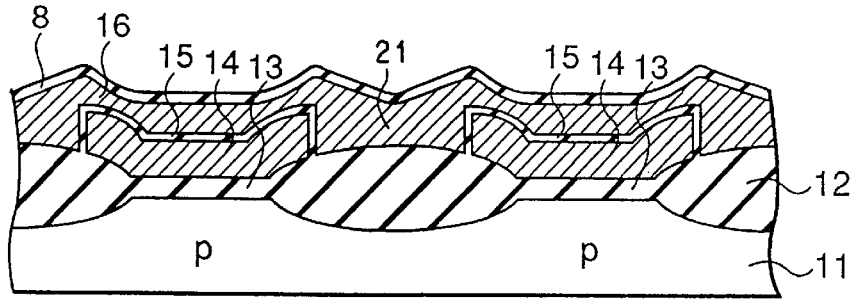
Figure 9C:
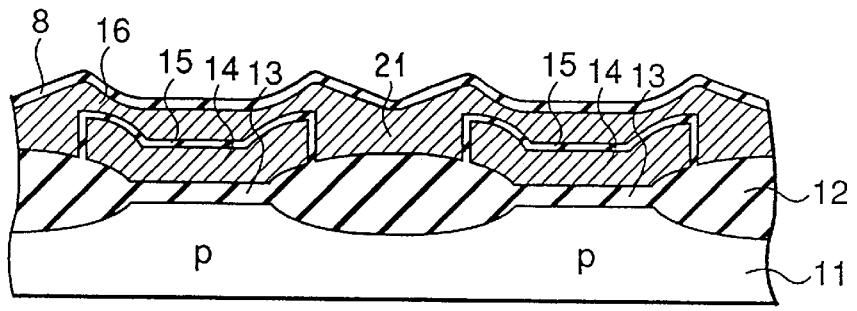

A manufacturing method according to a second embodiment of the present invention will now be described with reference to FIGS. 8A to 8C and FIGS. 9A to 9C. FIGS. 8A to 8C are vertically cross-sectional partial views illustrating in succession those steps of the method of the second embodiment, which are different from the steps of the first embodiment. FIGS. 9A to 9C are cross-sectional views taken along lines IV—IV in FIGS. 8A to 8C.

In the second embodiment, the first polysilicon conductive layer 32, which is formed on the semiconductor substrate 1 via the same thermal oxidation film as in the first embodiment, is processed and subjected to a heat treatment in the same manner as in the first embodiment. Then, a silicon nitride film, a silicon oxide film and a second polysilicon conductive layer 33 are deposited to form a lamination structure as shown in FIGS. 8A and 9A. The step illustrated in FIGS. 8A and 9A is exactly the same as that in FIGS. 5A and 7A relating to the first embodiment.

Then, a predetermined resist pattern is formed on the memory cell array region 30 by means of photolithography. Using the resist pattern as a mask, the second polysilicon conductive layer 33 in the memory cell array region 30 and peripheral circuit region 31 are anisotropically etched at a time by an RIE method. Further, a resist covering the peripheral circuit region 30 is formed by means of photolithography. Using the resist pattern on the memory cell array region 30, RIE is performed so that the ONO lamination film and first polysilicon conductive layer 32 in the memory cell array region 30 are anisotropically etched in succession and finally shaped. Alternatively, in the memory cell array region 30 and peripheral circuit region 31, the second polysilicon conductive layer 33 and similarly the silicon oxide film and silicon nitride film provided immediately below the conductive layer 33 are anisotropically etched by RIE. Subsequently, a resist film covering the peripheral circuit region 30 is formed, and the first polysilicon conductive layer 32 in the memory cell array region 30 is anisotropically etched. As a result, in the memory cell array region 30, the floating gate 14, second gate insulating film 15 and control gate 16 of the stacked gate structure of memory cell are formed. Similarly, the selection gates on the drain and source sides, as shown in FIG. 2A, are formed.

On the other hand, in the peripheral circuit region 31, the second polysilicon conductive layer 33 is selectively left on the side wall of the gate electrode at the time of the above-described anisotropical etching. The surface of the semiconductor substrate 11 including this structure is subjected to a heat treatment at about 800 to 900° C. in an oxidizing atmosphere, e.g. in the air. As is shown in FIGS. 8B and 9B, the selectively left portion of the second polysilicon conductive layer 33 is oxidized and a side wall 34 formed of a silicon oxide film is obtained. In addition, like the first embodiment, the oxide thin layer 8 is formed on the entire surface of the semiconductor substrate 11 and the corner portions at both ends of the floating gate 14 and control gate 16 in the memory cell array region 30 are rounded.

Then, as is shown in FIG. 8C, the semiconductor substrate 11 is doped with n-type impurities such as P or As by means of an ion implantaion method, with the control gate 16 and floating gate 14 being used as masks in the memory cell array region 30 and with the gate electrode 4 being used as a mask in the peripheral circuit region 31. Thereby, n-type diffusion layers 19, which will become source and drain regions of transistors of memory cells and MOS transistors constituting part of peripheral circuits, are provided. Subsequently, although not shown, an interlevel insulating film formed of a silicon oxide film is deposited by a CVD method on the entire surface of the semiconductor substrate 11. A contact hole for contact with a specific n-type diffusion layer 19 is formed in the obtained interlevel insulating film, and then a wiring layer of a bit line, etc., which is to be electrically connected to the n-type diffusion layer 19 via the contact hole, is provided. Thus, a nonvolatile semiconductor memory device, as shown in FIGS. 1A and 1B and FIGS. 2A and 2B, is fabricated.

Figure 10A:
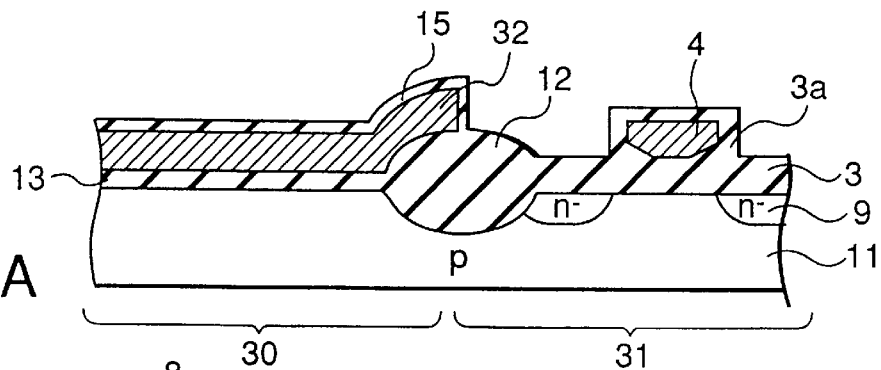
FIGS. 10A and 10B are vertically cross-sectional partial views showing a modification of the second embodiment of the invention.
Figure 10B:
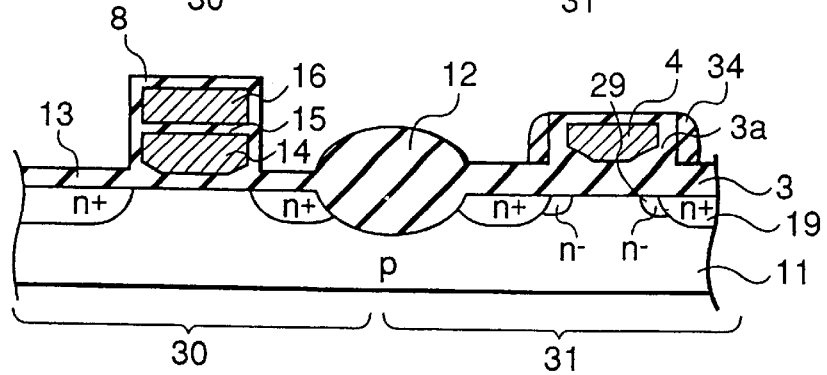

FIGS. 10A and 10B are vertically cross-sectional partial views showing a modification of the second embodiment of the invention. In this modification, before forming the stacked structure shown in FIGS. 8A and 9A by laminating the silicon nitride film, silicon oxide film and second polysilicon conductive layer 33, the semiconductor substrate is doped with n-type impurities such as P or As by means of ion implantation, with the first polysilicon conductive layer 32 shaped as a gate electrode in the peripheral circuit region 31 being used as a mask. Thus, n-type diffusion layers 9 shown in FIG. 10A are formed in advance. Subsequently, through the same steps as are shown in FIGS. 8A to 8C and 9A to 9C, a nonvolatile semiconductor memory device is fabricated. In this case, after the side wall 34 of silicon oxide film has been formed on the side wall of gate electrode 4, the semiconductor substrate 11 of the peripheral circuit region 31 is doped with n-type impurities once again. Accordingly, a MOS transistor with an LDD structure, wherein the n-type diffusion layer 19 has an n$^-$ region 29 near the channel, can be obtained.

In the above description, the method of manufacturing the nonvolatile semiconductor memory device according to the present invention is applied to the NAND type EEPROM. However, the present invention can be widely applied to other types of nonvolatile semiconductor memory devices having stacked gate structures, for example, NOR-type, DINOR-type and AND-type memory cells. These NOR-type, DINOR-type and AND-type memory cells will now be described with reference to circuit diagrams of FIGS. 11A to 14.

FIGS. 11A and 11B are circuit diagrams showing memory cells of a NOR type EEPROM. The EEPROM shown in FIG. 11A is provided with no selection gates, and the EEPROM shown in FIG. 11B is provided with selection gates. In the NOR type EEPROM shown in FIG. 11A, one memory cell is connected in series between a bit line BL and a source line VS intersecting with the bit line BL. Alternatively, as shown in FIG. 11B, a bit-line-side selection gate SG and one memory cell are connected in series between a bit line BL and a source line VS intersecting with the bit line BL.

Figure 12A:
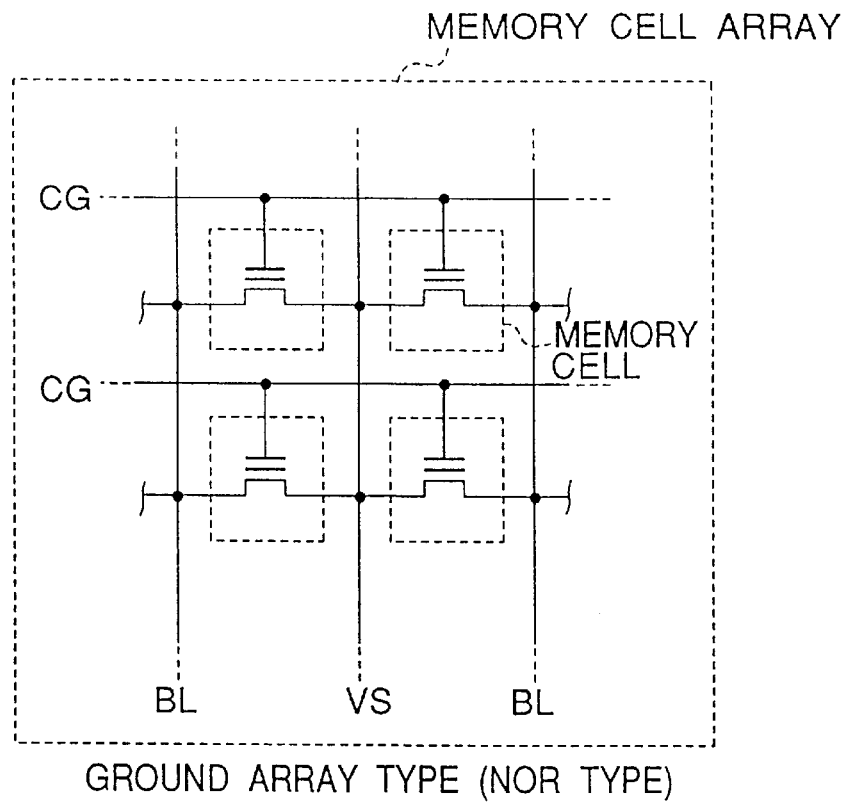
FIGS. 12A and 12B are circuit diagrams showing memory cells of other NOR type EEPROMs.
Figure 12B:
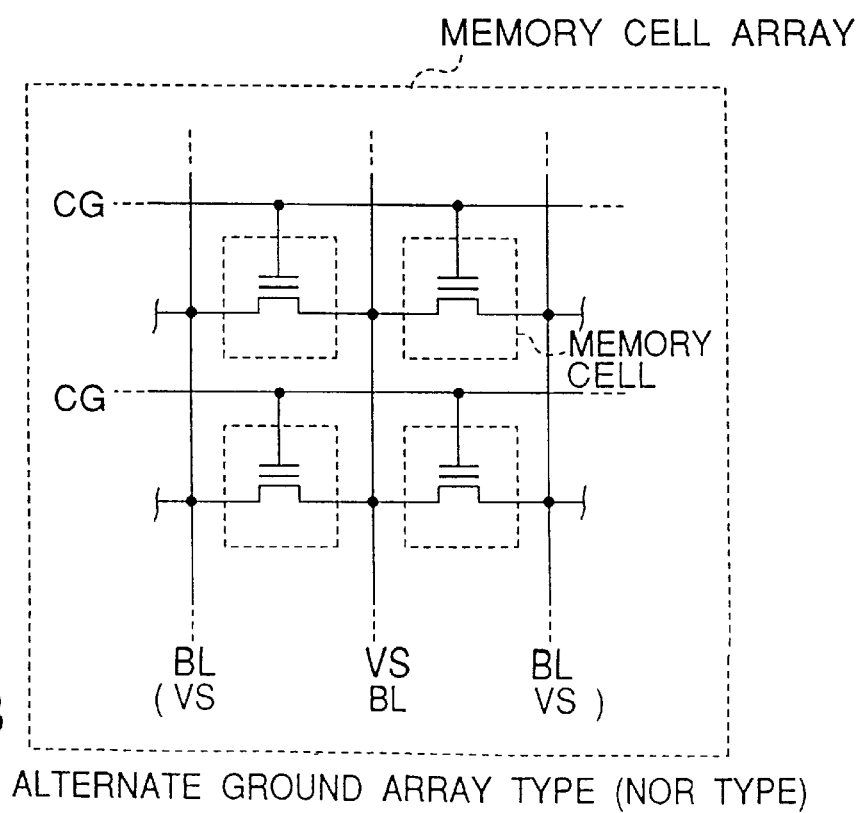

FIGS. 12A and 12B are circuit diagrams showing memory cells of so-called "ground array type" NOR-type EEPROMs. In particular, FIG. 12B shows an alternate ground array type EEPROM. As is shown in FIGS. 12A and 12B, in the ground array type NOR-type EEPROMs, one memory cell is connected in series between a bit line BL and a source line VS running in parallel to the bit line BL. In FIG. 12A, the bit line BL and source line VS are fixed. In the alternate ground array type EEPROM shown in FIG. 12B, the bit line BL and source line VS can be switched.

Figure 13:
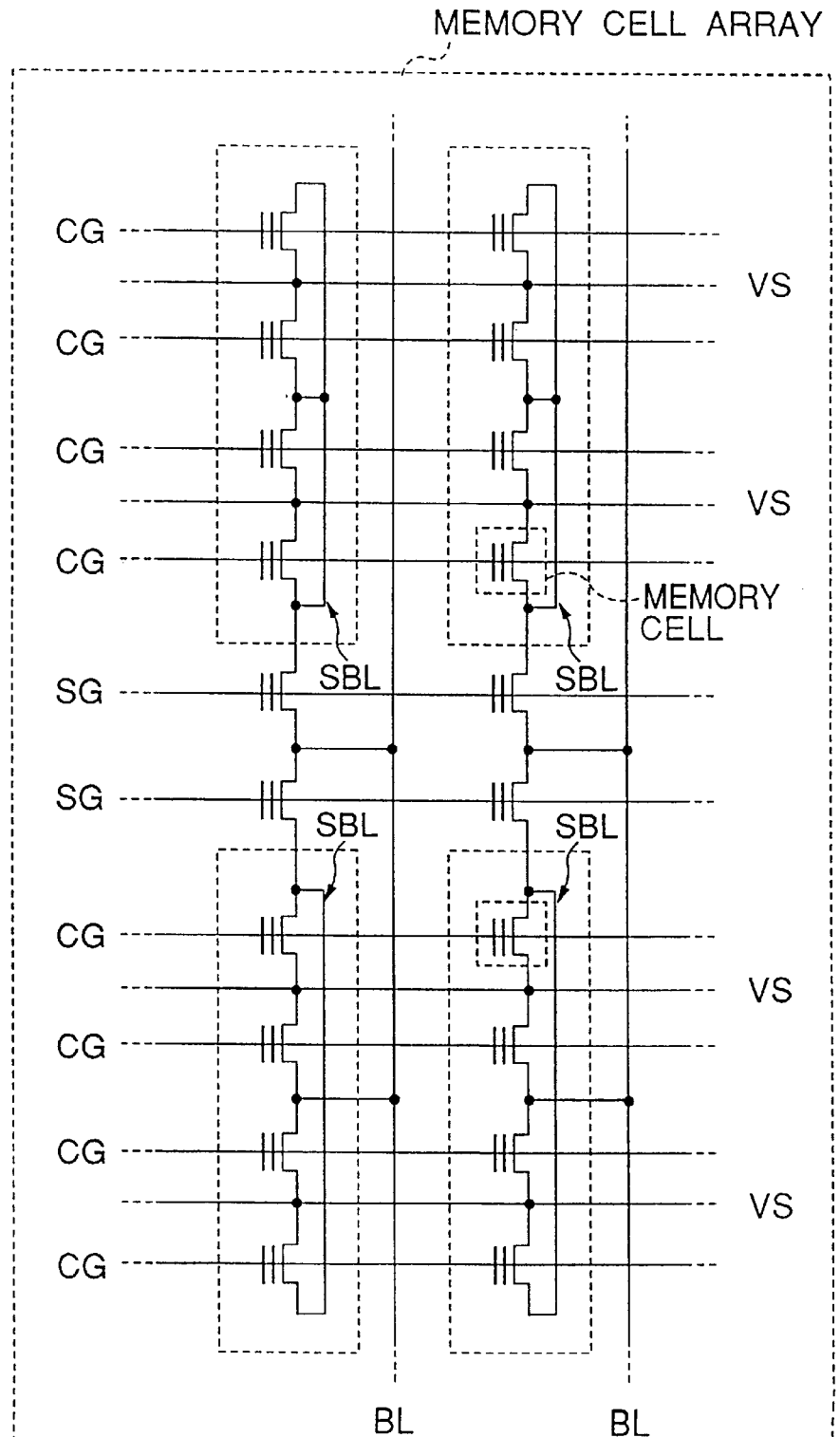
FIG. 13 is a circuit diagram showing memory cells of a DINOR type EEPROM.

FIG. 13 is a circuit diagram showing memory cells of a DINOR-type EEPROM. In the DINOR-type EEPROM, as shown in FIG. 13, memory cells are connected in parallel between one sub-bit line SBL and a plurality of source lines VS, and the sub-bit line SBL is connected to a bit line BL via a bit-line-side selection gate SG.

Figure 14:
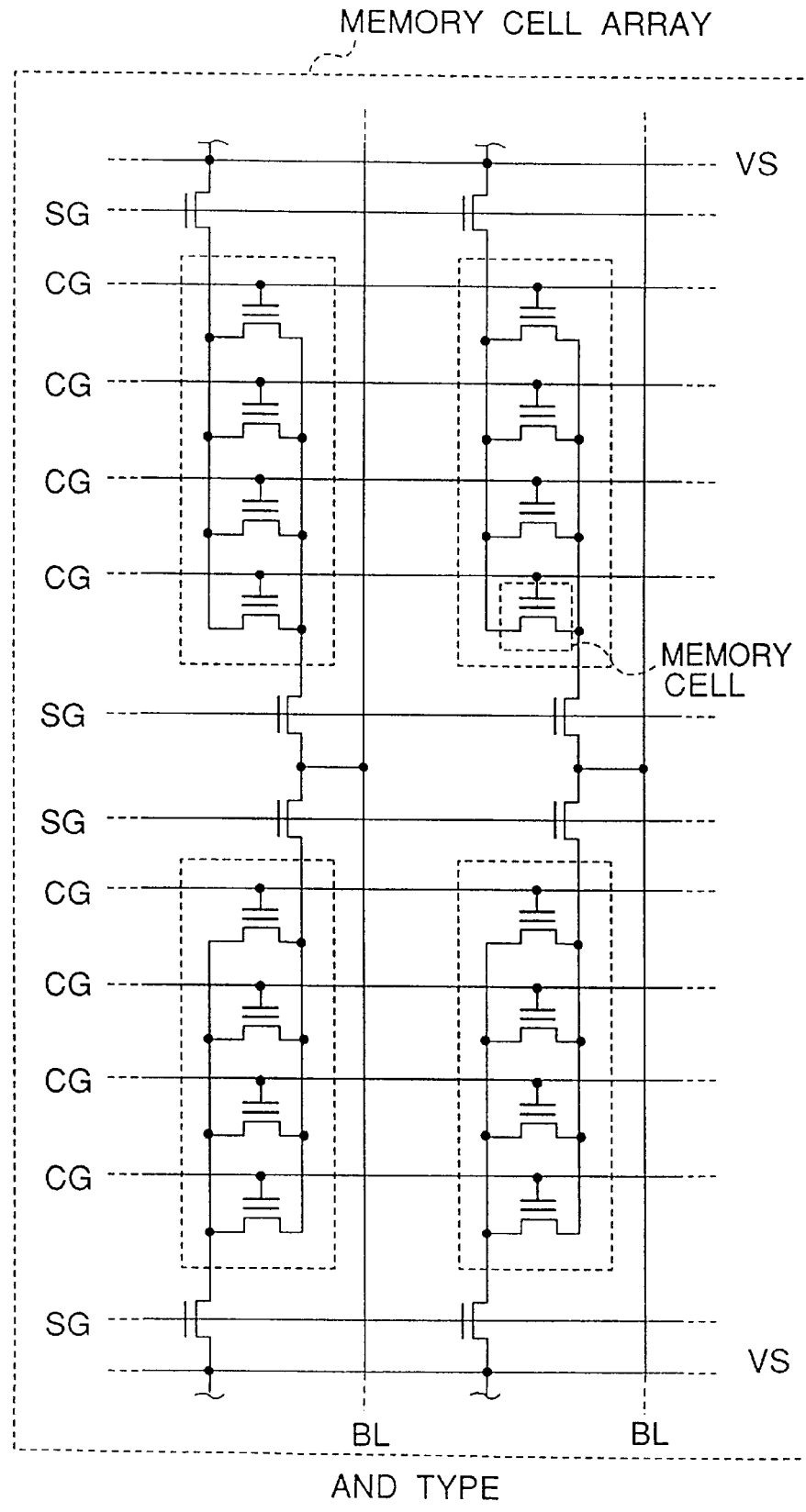
FIG. 14 is a circuit diagram showing memory cells of an AND type EEPROM.
Figure 15:
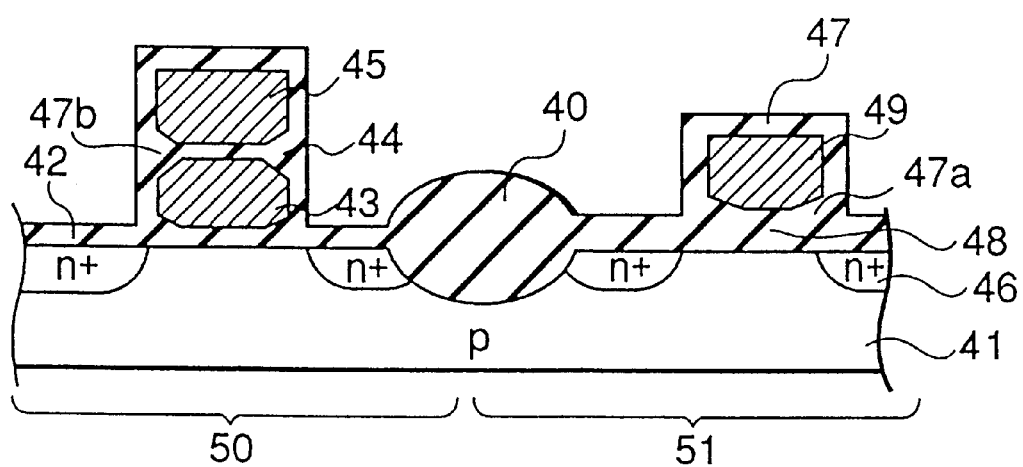
FIG. 15 is a vertically cross-sectional partial view of a conventional semiconductor memory device.

FIG. 14 is a circuit diagram showing memory cells of an AND-type EEPROM. In the AND-type EEPROM, as shown in FIG. 14, a bit-line-side selection gate SG, memory cells connected in parallel to each other, and a source-line-side selection gate SG are connected in series between a bit line BL and a source line VS.

In the present invention, as regards the MOS transistor constituting a part of the peripheral circuit, too, the structure of the MOS transistor is not limited to the n-channel type, which is shown in FIGS. 4A to 10B. There is no problem even if the MOS transistor is formed in a well having the same conductivity type as or the opposite conductivity type to the semiconductor substrate.

As has been described above in detail, according to the method of manufacturing the nonvolatile semiconductor memory device of the present invention, the insulation breakdown voltage of the high-breakdown-voltage type transistor in the peripheral circuit region can be increased, while a bias voltage applied to the memory cell region to write or erase data is not increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A method of manufacturing a nonvolatile semiconductor memory device having a memory cell array region and a peripheral circuit region defined on a semiconductor substrate, the method comprising the steps of:

forming an insulating film on the memory cell array region and the peripheral circuit region;

forming a first conductive layer on the insulating film;

patterning the first conductive layer into a gate electrode shape in the peripheral circuit region;

subjecting the first conductive layer thus patterned to a heat treatment in an oxidizing atmosphere wherein, a gate bird's beak is formed on a lower side of the first conductive layer processed into the gate electrode shape in the peripheral circuit region;

laminating a second conductive layer over the first conductive layer in the memory cell array region and the peripheral circuit region;

patterning the first and second conductive layers into predetermined shapes in the memory cell array region; and removing the second conductive layer in the peripheral circuit region.

2. The method according to claim 1, wherein, in the step of patterning the first conductive layer, a slit-like space is provided in the first conductive layer in the memory cell array region, while the first conductive layer is processed into a gate electrode shape in the peripheral circuit region.

3. The method according to claim 2, wherein, in the step of subjecting the first conductive layer to the heat treatment, a thermal oxidation film is formed on an upper surface and a side wall of the first conductive layer.

4. The method according to claim 1, wherein, in the step of patterning the first and second conductive layers in the memory cell array region, the first and second conductive layers are processed into predetermined shapes by means of anisotropic etching.

5. The method according to claim 4, wherein, in the step of removing the second conductive layer in the peripheral circuit region, the second conductive layer by means of isotropic etching.

6. The method according to claim 1, wherein, after the step of removing the second conductive layer in the peripheral circuit region, the semiconductor substrate is doped with impurities, while using as masks the first and second conductive layers processed into predetermined shapes in the memory cell array region and the first conductive layer processed into a gate electrode shape in the peripheral circuit region, whereby a source region and a drain region are formed.

7. The method according to claim 1, wherein the insulating film lying between the semiconductor substrate and the first conductive layer constitutes a tunnel oxidation film in the memory cell array region.

8. A method of manufacturing a nonvolatile semiconductor memory device having a memory cell array region and a peripheral circuit region defined on a semiconductor substrate, the method comprising the steps of:

forming an insulating film on the memory cell array region and the peripheral circuit region;

forming a first conductive layer on the insulating film;

patterning the first conductive layer into a gate electrode shape in the peripheral circuit region;

subjecting the first conductive layer thus patterned to a heat treatment in an oxidizing atmosphere wherein a gate bird's beak is formed on a lower side of the first conductive layer processed into the gate electrode shape in the peripheral circuit region;

laminating a second conductive layer over the first conductive layer in the memory cell array region and the peripheral circuit region;

patterning the first and second conductive layers into predetermined shapes in the memory cell array region, while selectively removing the second conductive layer in the peripheral circuit region so that part of the second conductive layer is selectively left on a side wall of the first conductive layer; and subjecting the second conductive layer selectively left on the side wall of the first conductive layer to a heat treatment in an oxidizing atmosphere.

9. The method according to claim 8, wherein, in the step of patterning the first conductive layer, a slit-like space is provided in the first conductive layer in the memory cell array region, while the first conductive layer is processed into the gate electrode shape in the peripheral circuit region.

10. The method according to claim 8, wherein, in the step of subjecting the first conductive layer to the heat treatment, a thermal oxidation film is formed on an upper surface and a side wall of the first conductive layer.

11. The method according to claim 8, wherein, in the step of subjecting the second conductive layer selectively left on the side wall of the first conductive layer to the heat treatment in the oxidizing atmosphere, an oxidation film is formed on a side wall of the gate electrode.

12. The method according to claim 8, wherein, in the step of patterning the first and second conductive layers in the memory cell array region and selectively removing the second conductive layer in the peripheral circuit region, anisotropic etching is performed.

13. The method according to claim 8, wherein, after the step of patterning the first and second conductive layers in the memory cell array region and selectively removing the second conductive layer in the peripheral circuit region, the semiconductor substrate is doped with impurities, while using as masks the first and second conductive layers processed into predetermined shapes in the memory cell array region and the first conductive layer processed into the gate electrode shape in the peripheral circuit region, whereby a source region and a drain region are formed.

14. The method according to claim 8, wherein said insulating film lying between the semiconductor substrate and the first conductive layer constitutes a tunnel oxidation film in the memory cell array region.

15. A method of manufacturing a nonvolatile semiconductor memory device, wherein said device comprises a memory cell provided in a memory cell array region defined on a semiconductor substrate and a MOS transistor constituting a part of a peripheral circuit provided in a peripheral circuit region defined on the semiconductor substrate, said memory cell comprises a first source region and a first drain region formed in the semiconductor substrate, a first gate insulating film formed on the semiconductor substrate between the first source and drain regions, a floating gate formed on the first gate insulating film as a charge accumulation layer, a second gate insulating film formed on the floating gate, and a control gate formed on the second gate insulating film, said MOS transistor comprises a second source region and a second drain region formed in the semiconductor substrate, a third gate insulating film formed on the semiconductor substrate between the second source and drain regions, and a gate electrode formed on the third gate insulating film, and said method comprises the steps of:

forming the first and third gate insulating films on the memory cell array region and the peripheral circuit region;

forming a first conductive layer on the first and third gate insulating films;

patterning the first conductive layer, thereby providing a slit-like space in the memory cell array region while processing the first conductive layer into the gate electrode in the peripheral circuit region;

subjecting the first conductive layer thus patterned to a heat treatment in an oxidizing atmosphere and forming a thermal oxidation film wherein a gate bird's beak is formed on a lower side of the gate electrode in the peripheral circuit region;

laminating a second conductive layer over the first conductive layer at least in the memory cell array region; and patterning in succession the second conductive layer, the thermal oxidation film and the first conductive layer in the memory cell array region, thereby forming the control gate, the second gate insulating film and the floating gate.

16. The method according to claim 15, wherein said slit-like space of the first conductive layer is provided to correspond to a device isolation region in the memory cell array region.

17. The method according to claim 15, wherein the first conductive layer comprises polysilicon, and a silicon oxidation film is formed by subjecting the first conductive layer to a heat treatment.

18. The method according to claim 15, wherein, after the step of forming the thermal oxidation film, a nitride film and an oxide film are successively formed on the thermal oxidation film formed on the upper surface and side wall of the first conductive layer, prior to the step of laminating the second conductive layer over the first conductive layer.

19. The method according to claim 15, comprising a step of doping the semiconductor substrate with impurities, using as masks the control gate and floating gate formed in the memory cell array region and the gate electrode formed in the peripheral circuit region, to form the first and second source and drain regions.

* * * * *